(12) United States Patent
Michel et al.

(10) Patent No.: US 9,602,140 B1
(45) Date of Patent: Mar. 21, 2017

(54) DATA RECOVERY USING FRAME MATCHING AND ERASURE WINDOWING

(71) Applicant: Seagate Technology LLC, Cupertino, CA (US)

(72) Inventors: Richard P Michel, Mineapolis, MN (US); Feng X Li, Victoria, MN (US)

(73) Assignee: Seagate Technology LLC, Cupertino, CA (US)

(*) Notice: Subject to any disclaimer, the term of this patent is extended or adjusted under 35 U.S.C. 154(b) by 130 days.

(21) Appl. No.: 14/551,638

(22) Filed: Nov. 24, 2014

(51) Int. Cl.
*H03M 13/00* (2006.01)
*H03M 13/39* (2006.01)
*H03M 13/37* (2006.01)
*H04L 1/00* (2006.01)

(52) U.S. Cl.
CPC ..... *H03M 13/3972* (2013.01); *H03M 13/373* (2013.01); *H04L 1/0057* (2013.01); *H04L 1/0061* (2013.01)

(58) Field of Classification Search
CPC .......... H03M 13/3972; H03M 13/373
See application file for complete search history.

(56) References Cited

U.S. PATENT DOCUMENTS

| | | | | |
|---|---|---|---|---|
| 6,791,995 B1* | 9/2004 | Azenkot | ........ | H04B 1/707 348/E5.008 |
| 7,047,190 B1* | 5/2006 | Kapilow | ........ | G10L 19/005 375/240 |
| 7,117,156 B1* | 10/2006 | Kapilow | ........ | G10L 19/005 370/281 |
| 7,158,539 B2* | 1/2007 | Zhang | ........ | H04L 65/607 370/470 |
| 7,725,800 B2 | 5/2010 | Yang et al. | | |
| 8,045,582 B1* | 10/2011 | Petrus | ........ | H04N 7/20 370/468 |
| 8,176,404 B2* | 5/2012 | Yang | ........ | G11B 20/10527 714/805 |
| 8,201,051 B2 | 6/2012 | Tan et al. | | |
| 8,341,495 B2 | 12/2012 | Tan et al. | | |
| 8,355,911 B2* | 1/2013 | Zhan | ........ | G10L 19/005 704/201 |
| 8,432,629 B1* | 4/2013 | Rigney | ........ | G11B 5/59661 360/27 |

(Continued)

FOREIGN PATENT DOCUMENTS

WO   WO2013102833   7/2013

OTHER PUBLICATIONS

Richardson, et al., Efficient Encoding of Low-Density Parity Check Codes, IEEE Transactions on Information Theory, vol. 47, No. 2, pp. 638-656, Feb. 2001, US.

*Primary Examiner* — Esaw Abraham
(74) *Attorney, Agent, or Firm* — Cesari & Reed, LLP; Kirk A. Cesari; Logan Brown

(57) ABSTRACT

The disclosure is related to systems and methods of data recovery using frame matching and erasure windowing. Aspects involve using frame matching in conjunction with erasure windowing to overcome data corruption in a set of data to allow recovery of the set of data. When a synchronization mark indicating the position of a set of data in a superset of data is corrupted, frame matching in conjunction with erasure windowing are used to enable recovery of the set of data by applying one or more frame windows and one or more erasure windows to data including the set of data to recover the set of data.

20 Claims, 5 Drawing Sheets

(56) References Cited

U.S. PATENT DOCUMENTS

| | | | |
|---|---|---|---|
| 8,634,478 B2 * | 1/2014 | Ciardi | G11B 27/323 375/240.28 |
| 8,650,457 B1 | 2/2014 | Yeo | |
| 8,677,218 B2 | 3/2014 | Zeng et al. | |
| 8,762,817 B1 * | 6/2014 | Chaichanavong | H03M 13/15 714/776 |
| 8,868,999 B1 * | 10/2014 | Varnica | H03M 13/373 714/752 |
| 8,910,009 B1 * | 12/2014 | Tang | H04L 1/0041 714/752 |
| 9,076,492 B2 * | 7/2015 | Singleton | G06F 11/14 |
| 2009/0070658 A1 | 3/2009 | Patapoutian et al. | |
| 2013/0173990 A1 | 7/2013 | Li et al. | |

* cited by examiner

DATA RECOVERY USING FRAME MATCHING AND ERASURE WINDOWING

SUMMARY

Data recovery systems and methods may include a receiver device configured to overcome data corruption as part of an acquisition of data including corrupted data, the corrupted data caused by defects in a corresponding preamble, and the data including at least a frame of data, and a sync mark indicating a relative position of the frame of data.

A method for data recovery may include receiving data, the data in turn including at least a frame of data, a first sync mark indicating a relative position of the frame of data, and a preamble corresponding to the frame of data. The method may further include attempting to determine the frame of data based on the sync mark. When the frame of data is not determined, data recovery may involve attempting to recover the frame of data by applying a frame window to the data to define a data set of the data, and applying an erasure window to the data set, nulling the data in the erasure window, and attempting to decode the data set. Application of frame windows to the data may be performed iteratively in conjunction with erasure windowing to recover data in the frame of data.

An apparatus may include a data recovery circuit and be configured to receive data, the data including at least a frame of data, a sync mark indicating a relative position of the frame of data, and a preamble corresponding to the frame of data. The apparatus attempts to determine the frame of data based on the sync mark, and when the frame of data is not determined, the data recovery circuit is configured to attempt to recover the frame of data by performing frame matching in conjunction with erasure windowing on the data.

DETAILED DESCRIPTION

Figure 1:
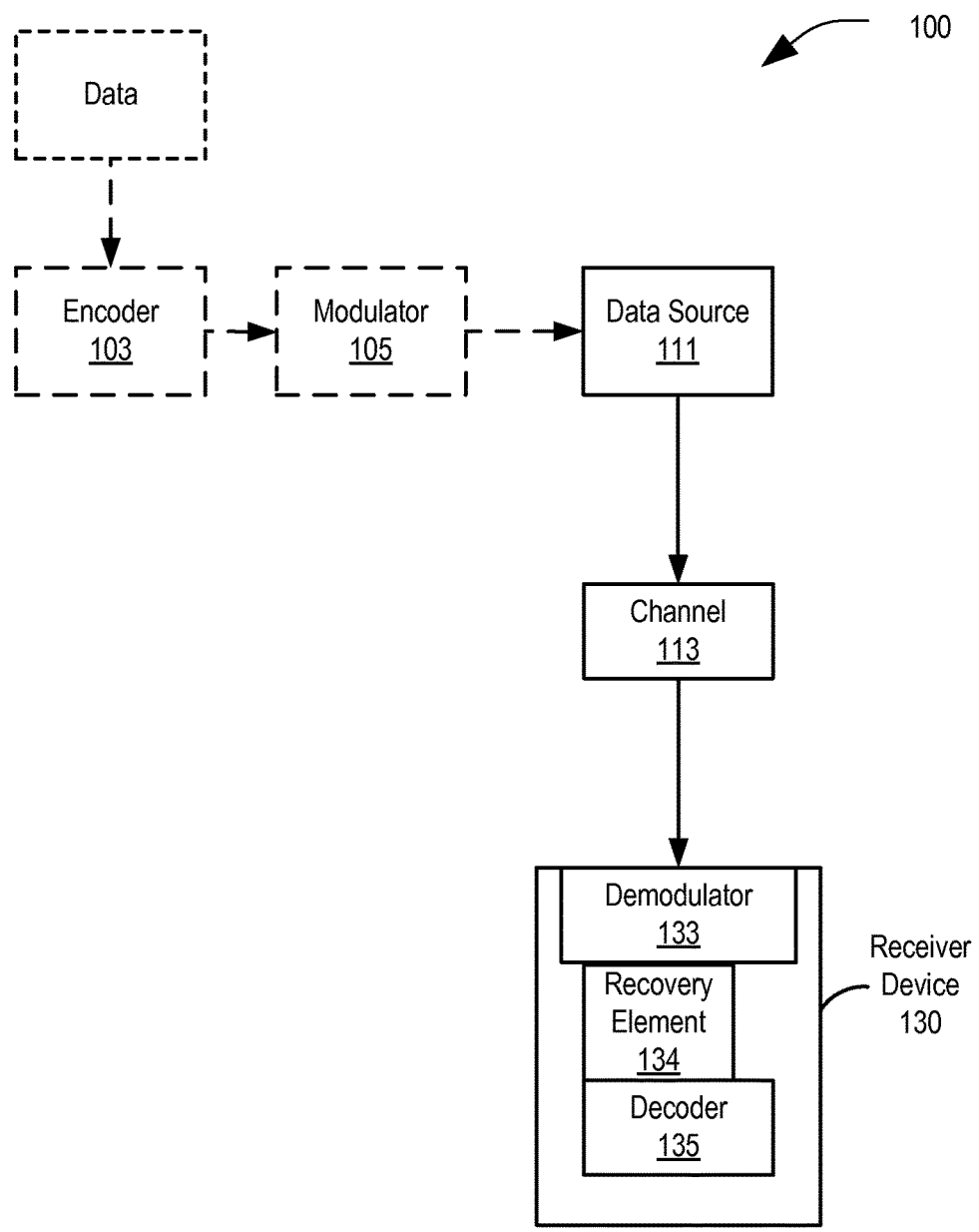
FIG. 1 is a diagram of a system for data recovery using frame matching and erasure windowing, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure.

In accordance with various embodiments, the methods and functions described herein may be implemented as one or more software programs running on a computer processor or controller. In accordance with various embodiments, the methods and functions described herein may be implemented as one or more software programs running on a computing device, such as a storage device, for example, a disc drive. Dedicated hardware implementations including, but not limited to, application specific integrated circuits, programmable logic arrays, and other hardware devices can likewise be constructed to implement the methods and functions described herein. Further, the methods and functions described herein may be implemented as a device, such as a computer readable storage medium or memory device, including instructions that when executed cause a processor to perform the methods.

Data received over a read channel or a read/write channel, or otherwise received, and stored in a memory or buffer may be problematic to decode. In some examples, the data stored may be indeterminate in the buffer, and the data and synchronization information associated with the data may be corrupted.

The data from a data channel may be received or stored in a frame, which may define or indicate a set of data. The frame may have a length which is defined by the set of data and the frame may be considered to span the set of data. The set of data may form the data payload of the frame. The frame may be associated with a corresponding preamble and synchronization mark (hereafter 'sync mark') to allow the frame to be detected and locked on, so that the data payload of the frame may be identified and decoded by a decoder. In some examples, a sync mark is a set of data located previous to the start of a frame of data to indicate the start of the frame of data. For example, the sync mark may be a series of samples or binary bits indicating the start of a frame.

In some instances, a frame-based decode operation performed on a set of data may fail. The failure of the decode operation may be caused by an incorrect or invalid frame of data being processed by the decoder. An incorrect or invalid frame of data may be caused by a poor quality or corrupted preamble or sync mark or both, such that the correct frame of data cannot be determined. Sometimes, a poor quality preamble can cause corruption in the sync mark and frame data. When the sync mark is damaged or corrupted, the sync mark may not be properly detected and failing to properly detect the sync mark may make it difficult to correctly delineate the associated frame and corresponding data, which, in some cases, can make the data corresponding to the frame unrecoverable.

For example, a data storage device may read a sector having a corresponding preamble which is corrupted or degraded, which can cause problems when attempting to recover the data of the sector. Such problems may include data corruption and sync mark corruption. More particularly, when the preamble fails to be locked on by a demodulation circuit or the lock is delayed due to a degradation in the preamble, this can cause the sync mark and data to be corrupted, obscuring the location of the frame due to sync mark loss. The corruption of the data can further cause additional problems because the decoder may reject the corrupted data, resulting in a decoder error.

To overcome data decode failure due to problems with the associated sync mark, frame matching can be iteratively performed on the data. Frame matching may be undertaken in which frame windows are iteratively matched to the data in a buffer (or other storage), and corresponding frames of data may be sent to the decoder. When the decoder correctly decodes a set of data in a frame, then the correct frame of data has been recovered.

A further decoding issue can be that data within a frame is corrupted. This data corruption may occur when the preamble is damaged or corrupted, and thus the receiver has difficulties in recovering the sync mark and data. For example, the preamble can include a frequency that a receiver may lock on. When this frequency is degraded or otherwise corrupted, the corrupted preamble may cause corruption of the sync mark and data because a receiver may take additional time to attempt to correctly lock on the corrupted preamble. There may be corrupting of the sync mark and data recovered before or during the time it took for the receiver to correctly lock on the preamble frequency. More particularly, when the preamble is degraded, the phase and frequency of the sampling of the data may be compromised during early data sampling in demodulation. Gradually, through adaptation during demodulation, the phase and frequency of sampling may improve, leaving errors toward the beginning of data samples.

To overcome data corruption in a frame of data causing decoding of the frame of data to fail, an erasure window can be applied to the data in the frame. The maximum size of the erasure window may correspond to the error correction capability of the decoder. For example, a low-density parity-check (LDPC) code graph may have a correction capability of up to ten percent of data to be decoded. Thus, an error correction window used in conjunction with a low-density parity-check (LDPC) decoder could have a maximum length corresponding to ten percent of the data in a frame.

When decoding a frame of data, an erasure window may be iteratively applied to the data in the frame until the erasure window corresponds to the corrupted data to null the corrupted data such that correct data may be reconstituted by the decode (at the decoder), and the decode of the frame of data completed.

When both the sync mark and data are corrupted, both frame loss and data decode failure may occur, causing problems in recovering the data in a frame. To overcome this, the systems and methods described herein can implement frame matching in conjunction with erasure windows. For example, frame matching may be iteratively performed on data in a buffer together with iteratively applying erasure windows to each iteration of attempted framing. Thus, a first frame may be applied to stored data to define a first frame position on the data, and an erasure window can also be applied to the stored data within the bounds of the frame. Then, a decode operation at the decoder may be performed on the data delineated by the applied frame. If the decode operation fails, a decode operation may be repeated on data delineated by the position of the first frame with the erasure window nulling a different set of data in the frame. The erasure window may be iteratively moved relative to the first frame and the decode operation retried until the decode operation is successful or the erasure window has been iteratively applied to all the data in the frame without a successful decode operation.

If no successful decode operation occurred with regard to the first frame position, then a second iteration of attempted framing may be applied to the stored data at an offset from the first frame position relative to the data. For example, the frame position at the second iteration may be offset from the first frame position by a number of bits or symbols of data. Iterative erasure windowing may be applied to the second iteration of framing as described above, and this iterative framing and application of erasure windows can be repeatedly applied to the data until a frame of data is successfully decoded.

Referring to FIG. 1, certain embodiments of a system suitable for frame-based data recovery are shown and generally designated 100. The system 100 can include a data source 111, a channel 113, and a receiver device 130 including a demodulator 133, a recovery element 134, and a decoder 135. In some embodiments, the data source 111 may include a non-volatile data storage device, such as a hard disc, a flash memory device, a compact disc, another storage device, or any combination thereof. The channel 113 may include a data bus or read/write device, or both, to allow data to be passed between the data source 111 and the receiver device 130. Data may be provided to the data source 111 by an encoder 103 in conjunction with a modulator 105.

The encoder 103 may encode data and the encoded data may be passed to the modulator 105. The modulator 105 may modulate the encoded data, and the encoded and modulated data may be stored at the data source 111 which functions as the data store for the encoded and modulated data. Encoding and modulating with encoder 103 and modulator 105 may be optional, as indicated by the dashed outlines of encoder 103 and modulator 105.

The receiver device 130 may receive encoded and modulated data from the data source 111 over the channel 113. More particularly, the demodulator 133 of the receiver device 130 may receive encoded and modulated data from the data source 111 over the channel 113. As would be understood by one of skill in the art, encoding and modulating may be optional, and the received data may not have been encoded or modulated, in which case demodulation would not be performed. The demodulator 133 may demodulate the received data. The demodulated and encoded data may be stored, for example, by buffering, and the demodulated and encoded data may be transferred to the decoder 135 for decoding. In the event that the data was not encoded or modulated, then the unmodulated or unencoded data may be stored.

The receiver device 130 can include a recovery element 134. The recovery element 134 may be configured to perform frame matching in conjunction with the application of one or more erasure windows on the stored data to recover data. The frame matching may be performed iteratively, and the erasure windowing may also be performed iteratively.

Figure 2A:
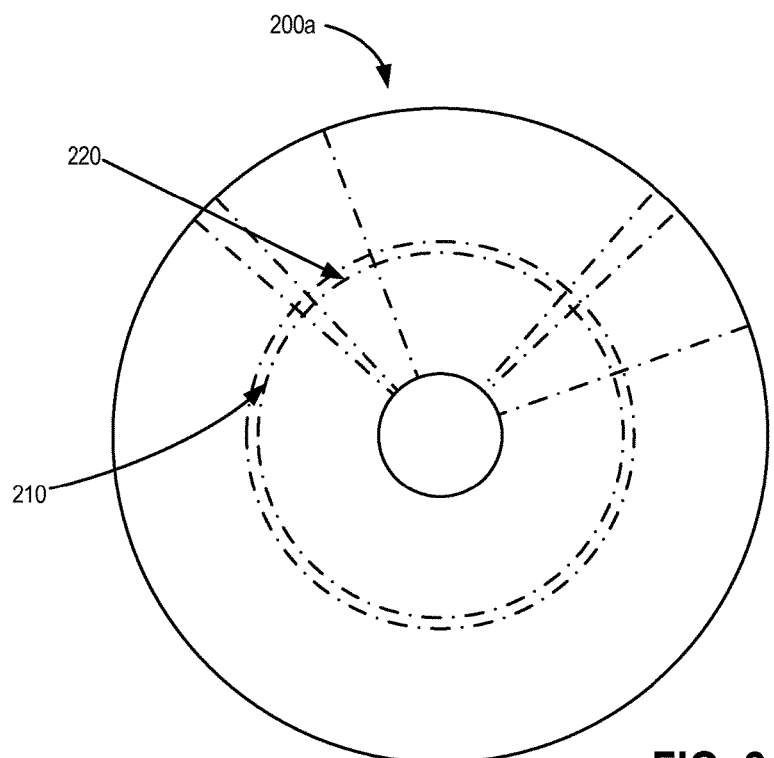
FIGS. 2a and 2b are diagrams of embodiments of a disc and a sector, respectively, in accordance with certain embodiments of the present disclosure.

Referring to FIG. 2a, an example of a data storage medium configured to store and provide data is shown and generally designated 200a. Storage medium 200a may be a physical disc which may store data. For example, the physical disc 200a may be a magnetic disc storing data as magnetic patterns. The magnetic patterns on the disc 200a may be read by a transducer and provided to a data channel for processing.

Figure 2B:
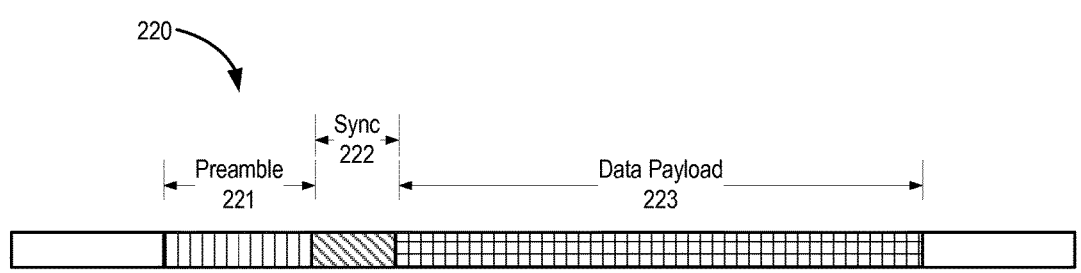

Data may be organized on disc 200a in tracks, for example, track 210, which may contain sectors, for example, sector 220. Each sector may include a preamble, a sync mark, and a frame containing the data payload. FIG. 2b illustrates the example sector 220, which can include a preamble 221, a sync mark 222 and a data payload 223. The data payload 223 can be defined by a frame having a frame size corresponding to the storage capacity of the sector 220 storing the respective data payload 223. For example, the bits in the sector may include user bits and an encoding bit. In this example, the frame size may depend on the user storage capacity of the sector and the encoding algorithm. Thus, the data storage capacity of the sector 220 delineates the frame size defining the data payload 223. Data stored on the disc 200a may be stored in sectors, each sector corresponding to a frame of data having a corresponding preamble and sync mark.

In one example, the preamble 221 can include a frequency to which a demodulator may lock on. For example, the demodulator may include a phase-locked-loop (PLL) circuit configured to synchronize to the frequency of the preamble. In some embodiments, the sync mark 222 may indicate a start of the frame that includes the data payload 223. When stored on the disc 200*a*, the data in the sector 220 may degrade and the preamble 221 may degrade, such that its frequency varies from an initial frequency when the preamble was first stored. Similarly, the sync mark may degrade, and corruption may be introduced into the data payload.

When the sector 220 is read from its corresponding track 210 on the disc 200*a* and the preamble 221 is degraded, the frequency degradation of the preamble 221 can cause problems in demodulating the sync mark 222 or data in the data payload 223. A degraded preamble may cause data or sync mark corruption. More particularly, when the frequency of the preamble 221 fails to be locked on by the PLL loop or the lock is delayed due to frequency degradation, such can cause the sync mark 222 and data to be corrupted. Corruption of the sync mark 222 may obscure the location of the frame of the data payload 223 because the corrupted sync mark may not correctly indicate the frame delineating data payload 223. The corruption of the data in the data payload 223 can further cause additional problems in decoding because the decoder may reject the data of the data payload 223 due to corrupted data in the payload 223 when performing a decode operation on the data, resulting in a decoder error. To recover the frame and data, frame matching and erasure windowing may be used in conjunction.

For example, a data recovery technique may involve applying a frame together with an erasure window to a set of data in a buffer (or other storage) corresponding to a corrupted sector. The data in the buffer may span more data than the specific sector and sector data to be recovered. The data recovery technique may involve attempting to perform a decode operation on the data in the applied frame together with applying an erasure window to a set of data in the frame, and nulling the data values in the erasure window within the frame. If the decode operation fails, then the data recovery technique may involve iteratively moving the erasure window along the data in the applied frame (to null different sets of potentially corrupted data) and iteratively attempting the decode operation for each respective iteration of the erasure window. Once the erasure window has been iteratively applied along the length of the frame and if the decode operation still fails, the frame then can be iteratively moved in position relative to the data in the buffer, and the erasure window iteratively applied and decode operations attempted as above. When a decode operation successfully decodes a set of framed data, the applied frame matches the sector frame and the corrupted data in the frame has been nulled by the erasure window, allowing for a successful decode operation of the data in the frame.

Figure 3:
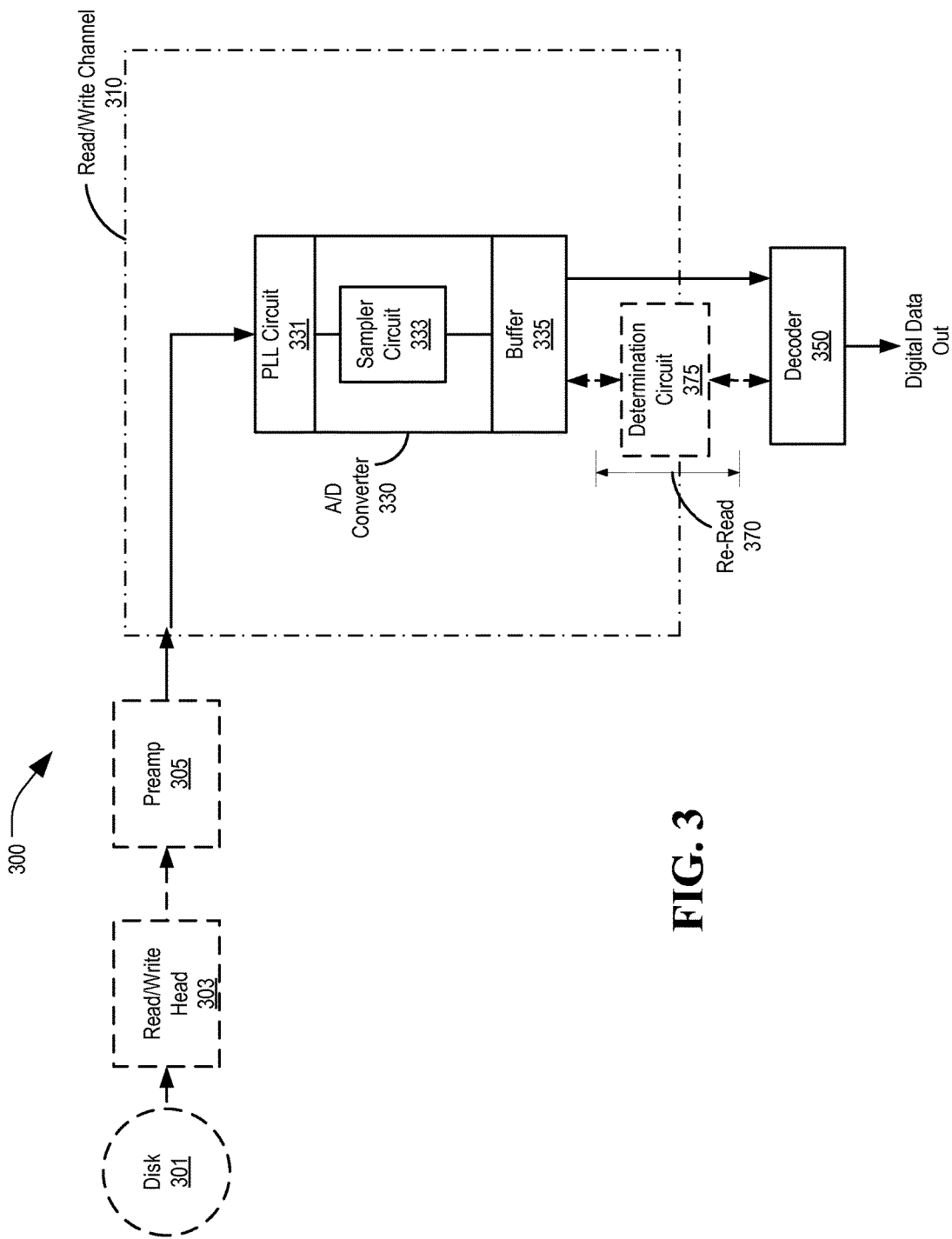
FIG. 3 is a diagram of a data recovery system, in accordance with certain embodiments of the present disclosure.

Referring to FIG. 3, certain embodiments of a data recovery system capable of iterative frame matching and erasure windowing are shown and generally designated 300. The system 300 may include a read/write head 303 capable of reading data from and writing data to a disc 301. Data recovery system 300 may further include a preamp 305 for amplifying signals from the read/write head 303. Amplified signals from the preamp 305 may be provided to the Read/Write channel 310. Disc 301, read/write head 303, and preamp 305 are optional as indicated by the dashed lines surrounding elements 301, 303, and 305 in FIG. 3. Nonetheless, a signal including data can be provided to read/write channel 310.

The Read/Write channel 310 may include an Analog to Digital (A/D) Converter 330. The A/D converter 330 may include a PLL (phase-locked-loop) circuit 331, a sampler circuit 333, and a buffer 335.

In FIG. 3, the PLL circuit 331 and the buffer 335 are shown as integral to the A/D converter 330, however, in other examples, one or both of the PLL circuit 331 and the buffer 335 may be separate components, or components thereof may be separate components from the A/D converter 330.

The A/D converter 330 may store data in the buffer 335. The data recovery system 300 may also include a decoder 350 which may decode data from buffer 335 and output digital data upon successful decode of the data. The decoder 350 may be a turbo decoder, low-density parity-check (LDPC) decoder, or any other decoder. Depending upon the type of encoding and the selected decoder technology, the decoder 350 may be able to correct errors in the data. For example, in the case of LDPC decoders, the decoder 350 may be able to correct up to a certain number of errors in the data. For each set (or frame) of data decoded, an LDPC decoder may be able to reconstitute up to a certain amount of the data if the data is nulled due to the application of an erasure window. The amount of data that can be reconstituted varies, but may be as high as ten percent of data in a set of data.

In the data recovery system 300, a re-read feedback 370 including a determination circuit 375 may be provided between the decoder 350 and the buffer 335. In the event that a decode operation at the decoder 350 fails, signals may be propagated from the decoder 350 to the buffer 335 via the determination circuit 375. More particularly, when a decode operation at the decoder 350 fails, the decoder 350 may output a decode operation failure signal which can be received at the determination circuit 375. In response to receiving the decode operation failure signal, the determination circuit 375 may determine that a decode operation performed on a set of data has failed. In some embodiments, the determination circuit 375 may determine that a decode operation has failed for a frame of data. In response to determining that the decode operation at the decoder 350 failed, the determination circuit 375 may send a send signal to the buffer 335 which can cause the buffer 335 to send a different data set to the decoder 350. Thus, the re-read feedback 370 allows for different data sets to be sent from the buffer 335 to the decoder 350 for decode attempts.

During operation of the data recovery system 300, the read/write head 303 may read one or more sectors from a track on the disc 301. The read/write head 303 may provide a signal representing data from the one or more sectors to the preamp 305, which may amplify the signal to generate an amplified signal.

The data recovery system 300 may provide the amplified signal to the read/write channel 310, which may include one or more filters to filter the amplified signal (not shown). The PLL loop 331 of the A/D converter 330 may acquire a sector signal by locking onto a preamble of a sector, for example by locking onto a frequency and phase of a preamble detected in the amplified signal.

The sampler circuit 333 can sample data from the sector. A sampling system or circuit may have continuous feedback loops that analyze a small number of incoming samples and continuously adjust to optimize the sampling phase and frequency and thereby track slow drifts in the data throughout the sampling of the sector.

The sampled data may be stored in the buffer 335. A set of sampled data from the buffer 335 can be provided to the decoder 350, and this set of sampled data may be a subset of the sampled data in the buffer 335. The decoder 350 may attempt to decode the provided set of sampled data from the buffer 335, if the decode operation is successful, digital data can be output.

If the data recovery system 300 determines that the decode operation at the decoder 350 failed, then the re-read 370 feedback can provide a signal to determination circuit 375 indicating failure of the decode operation. More particularly, in the event of a failure of a decode operation, the decoder 350 provides a decode operation failure signal to determination circuit 375. In response to the decode operation failure signal, the determination circuit 375 may iteratively apply frame matching in conjunction with erasure windows to the data in buffer 335 to try to recover data. The determination circuit 375 may issue one or more commands to the buffer 335 to provide further sets of data to the decoder 350 for decoding. Furthermore, the further sets of data may each have a respective erasure window applied thereto such that data in each set of data is nulled before being provided to the decoder 350.

The decoder 350 may reconstitute the nulled data in a received set of data before attempting decoding of the set of data. That is, a set of data having an erasure window applied thereto will have nulled data. Prior to decoding this set of data, the nulled data may be reconstituted from the remaining data in the set of data such that a full set of data is decoded at decoder 350. For example, the decoder may reconstitute the nulled data during the decoding process.

Figure 4A:
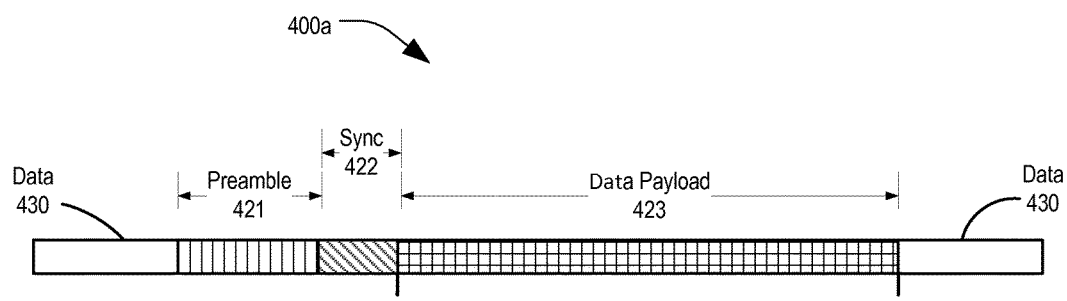
FIGS. 4a and 4b are diagrams of a sector and a set of frame windows, respectively, in accordance with certain embodiments of the present disclosure.

Referring to FIG. 4a, an embodiment of a sector is shown and generally designated 400a. The sector 400a includes a preamble 421, a sync mark 422, and a data payload 423. The size of the data payload 423 may correspond to a frame of data. That is, the data payload 423 may be a frame of data for the sector 400a. Surrounding the sector 400a in the buffer may be data 430 from other sectors, such as preceding or succeeding data. In the event that the sync mark 422 is corrupted, the relative location of the frame defining the data payload 423 may not be known due to the sync mark failure. If data in the data payload 423 is corrupted, then the corrupted data may cause decoder failure even when the frame of the data payload 423 is correctly matched and the correct frame of data sent to the decoder for decoding. To recover data in the data payload 423, frame matching can be performed in conjunction with the application of erasure windows to allow frame recovery and to null out corrupted data in the data to allow for a successful decode operation at the decoder. The frame matching and application of erasure windows can be performed iteratively until the correct frame of data for the sector 400a is received at, for example, a decoder for decoding.

Figure 4B:
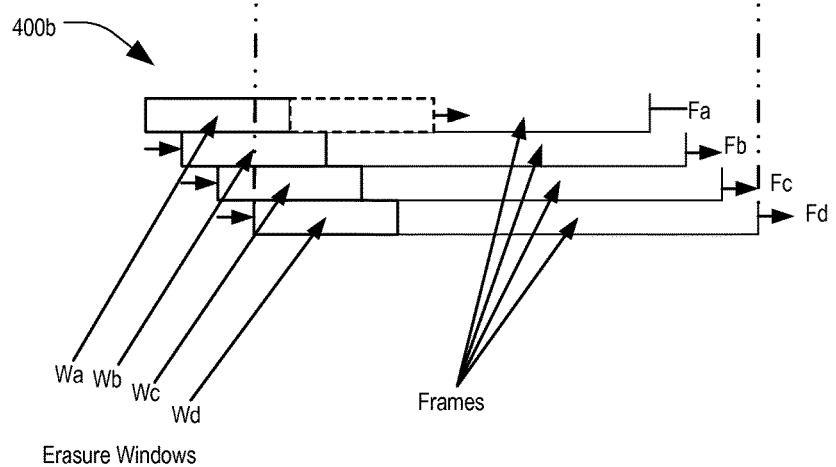

In FIG. 4b, iterative frames and corresponding erasure windows are illustrated generally at 400b. Thus, a set of four frames (Fa, Fb, Fc, and Fd) with corresponding erasure windows (Wa, Wb, Wc, and Wd) are shown. Presuming that the sync mark 422 of sector 400a is corrupted or lost, the frame bounding or defining the data payload 423 is unknown and thus the begin and end points of the data payload 423 are not known. Frame matching can be used to try to recover the frame of sector 400a and thus data payload 423. If a portion of the data payload 423 is corrupted, then an erasure window can be used to null out the corrupted data to allow for a successful decode operation by a decoder. Frame matching can be iteratively performed and erasure windows may be iteratively applied per framing iteration. Multiple frames may be applied to a set of data and for each application of a frame, one or more erasure windows may be applied to a set of data defined by the frame.

In an example, when the location of the data payload is uncertain due to corruption or loss of the sync mark, a frame Fa can be applied to the data. The frame Fa can have a corresponding erasure window Wa that can null or otherwise cancel data within the bounds of the erasure window Wa. As can be seen from comparing the frame Fa with the data payload 423, the frame Fa would not correctly frame the data payload 423, so a decode operation performed on data using this applied frame may fail. However, this is not known and the erasure window Wa can be iteratively moved down the frame Fa, as shown by the broken-lined rectangle, to allow nulling of different data and decoding attempted with nulled data corresponding to a position of an iteration of the erasure window until the erasure window Wa reaches the end of the frame Fa. When all decode operations performed with erasure window Wa at different locations on the frame Fa fail, then the system knows that the frame Fa is not the correct frame match to the data payload 423.

Then it is attempted to frame match the frame Fb to the data payload 423 similar to the process described above, where the erasure window Wb is iteratively moved along the length of the frame Fb. As is shown in 400b, Fb is offset from Fa by a number of data bits or symbols relative to the data payload 423, thus representing a different possible framing of the data payload 423. As can be seen from comparing 400a and 400b, the applied frame Fb does not match the data payload 423, so is not the correct frame relative to the data payload 423, and all attempted decodes of data based on the frame Fb may fail, regardless of the iterative location of the erasure window Wb.

The above process continues, with the frames Fc and Fd iteratively applied to the data payload 423 in succession, each of frames Fc and Fd offset from frames Fa and Fb, and each other, as illustrated in FIG. 4b. As can be seen from comparing 400a and 400b, the frame Fd matches the frame of the data payload 423. When the erasure window Wd nulls out corrupted data in the data payload 423, the decode operation performed based on the data defined by the applied frame Fd may be successful, and data in the data payload 423 will be recovered. That is, the applied frame Fd matches the correct frame of the buffered data payload 423, such that when corrupted data in the frame Fd is nulled, data bounded by the applied frame Fd may be successfully decoded.

Figure 5:
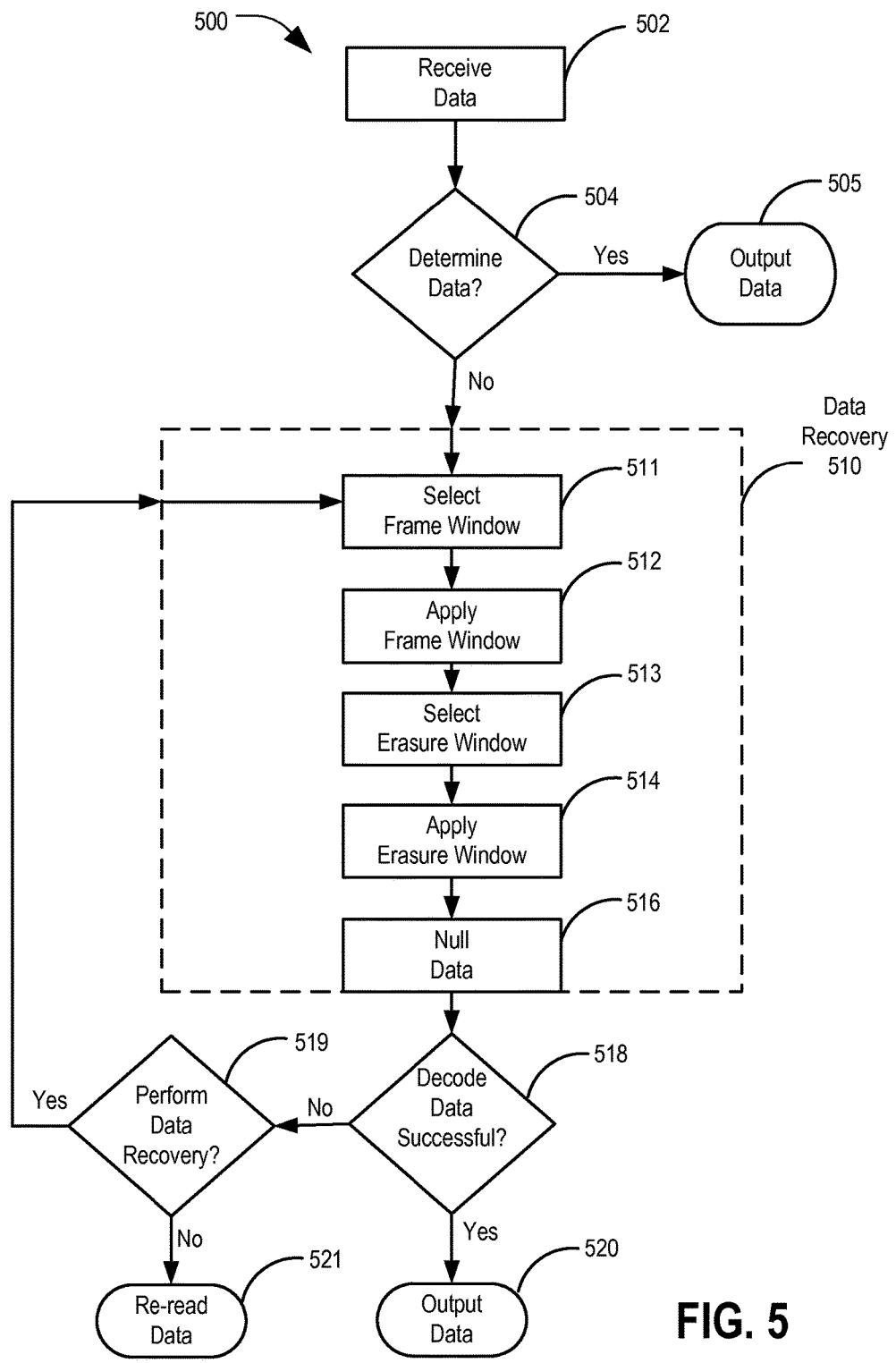
FIG. 5 is a flow chart of aspects of data recovery, in accordance with certain embodiments of the present disclosure.

Referring to FIG. 5, a flow chart for data recovery, according to certain embodiments, is shown and generally designated 500. One or more aspects of the flow chart may be performed, for example, with a data recovery system. During operation, at 502, data is received, the data including at least a first frame of data, a first sync mark indicating a relative position of the first frame of data (in the data), and a first preamble corresponding to the first frame of data. The received data may come from a read operation performed on a sector of a disc. At 504, it is attempted to determine the first frame of data based on the first sync mark. For example, it may be attempted to decode the first frame of data. If the first frame of data is determined, at 505, decoded data is output. If the first frame of data is not determined, at 510, it is attempted to recover the first frame of data by performing data recovery.

At 511, a first frame window is selected to apply to the data in a first iteration of frame matching, a length of the first frame window corresponding to a length of the first frame of data. At 512, data recovery proceeds by applying the first frame window to the data to define a first data set of the data.

At 513, an erasure window is selected, the erasure window having a length that is a subset of the length of the first frame of data. At 514, the first erasure window is applied to the first data set at a relative position within the first data set. At 516, the data in the first erasure window is nulled. And at 518, it is attempted to decode the first data set. If the decode operation is successful, then at 520, data is output.

If, however, the decode operation is not successful, it is determined whether to perform data recovery on the data at 519. If it is decided not to perform data recovery, at 521 the data is re-read or otherwise re-received or acquired.

If, however, it is decided to perform data recovery, it is attempted to recover the first frame of data by continuing to perform data recovery at 510. In some aspects, at 511, a second frame window is selected which is offset from the first frame window by one or more bits (or symbols). At 512, the second frame window is applied to the data offset from the first frame window by one or more bits (or symbols) to define a second data set of the data different from the first data set.

At 513, a second erasure window is selected, the erasure window having a length that is a subset of the length of the second data set. The second erasure window is applied to the beginning of the second data set at 514. At 516, the data in the second erasure window is nulled. And at 518, it is attempted to decode the second data set. If the decode operation is successful, then at 520, data is output.

If the decode operation is not successful, the data recovery at 510 may be repeated for a set number of attempts with different frame windows or different erasure windows or both. For example, data recovery may be performed for a selected number of framing attempts, and then it may be decided to attempt to re-receive the data, for example, by rereading a sector of a disc including the data. The application of frame windows to the data may be performed iteratively and may be performed for a fixed number of iterations. In a further example, it is typically assumed that rereading the data from the disc will bring the highest probability of recovering the data, so data recovery is performed until it is possible to reread the data from the disc.

Using frame matching in conjunction with erasure windowing allows for recovering frames of data in the event a corresponding sync mark is corrupted to be unusable or inadequate. A preamble that is degraded may cause loss or corruption of the sync mark and further may cause corruption of the data in the frame of data, particularly at the beginning of the frame of data. Because of the corruption of the data in the frame of data, the frame of data will not decode correctly when sent to a decoder, even if the correct frame can be surmised through frame matching. The above discloses methods and techniques for using frame matching together with erasure windowing that may overcome frame loss and degraded data to enable recovery of frames of data. Embodiments of techniques and methods described herein may enable higher format efficiency through shorter preambles, by managing the increased synchronization mark misses and data corruptions caused by a shorter preamble giving a receiver less time for signal and sector acquisition.

While erasure windows could initially be located at any position relative to the frame being applied to the data payload to be recovered, as discussed above, sync mark failure, and thus frame loss, is often due to a frequency degradation or other degradation of the preamble, and this in turn causes data acquisition problems that tend to affect the first part of the data payload, before the PLL circuit firmly locks on the sector. Thus, an erasure window initially located at the front of the frame being matched to a data payload of a sector is statistically more likely to null corrupted data in the data payload preventing decoding.

Thus, in some embodiments, it may be desirable to have an erasure window positioned at the beginning of each frame iteration, and to perform iterative frame matching with the erasure window at a fixed location relative to the respective frame before iteratively adjusting the relative position of the erasure window with respect to the respective frame. This may result in a successful decode of a frame of data relatively sooner than other methodologies which do not account for the likely location of data corruption in the data payload.

In some aspects and implementations, a pointer may be used to indicate or point to a sync mark or presumptive sync mark in a memory or a buffer. In some aspects and implementations, the length of the erasure window used in a data recovery operation depends on a quality of the data or the samples being acted upon by the data recovery operation. For example, the length of the erasure window may depend on a signal to noise ratio associated with the data having the erasure windows applied. Also erasure windows of different lengths may be used in a data recovery process.

While the above embodiments are discussed above in regard to preambles including a frequency, and demodulation, it will be appreciated by one of skill in the art that the methods and techniques described above are not so limited. For example, the above methodologies can be applied whenever a data frame is lost and corruption in the data itself renders recovery of the data problematic. Thus, the techniques could be applied in a completely digital realm with no demodulation, for example. Likewise, encoding of the data is optional and the data to be recovered may not have been encoded. Still further, while embodiments have been discussed with regard to the specific example of a disc, sectors and data stored on a disc, these are explicative embodiments of techniques and methods set forth in this disclosure and are not limiting. Techniques and methods disclosed herein may be used for data recovery on any framed data received over a channel.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A method comprising:
   receiving data, the data including at least a first frame of data, a first sync mark indicating a relative position of the first frame of data, and a first preamble corresponding to the first frame of data;
   attempting to determine the first frame of data at a first position based on the first sync mark;
   when the first frame of data is not determined, attempting to recover the first frame of data by:
   applying a first frame window at a second position different from the first position to the data to define a first data set of the data, a length of the first frame window corresponding to a length of the first frame of data;
   applying a first erasure window to the first data set;
   nulling the data in the first erasure window; and
   attempting to decode the first data set.

2. The method of claim 1, further comprising:
   applying a second frame window to the data to define a second data set of the data different from the first data set; and
   attempting to decode the second data set.

3. The method of claim 2, a length of the second frame window corresponding to the length of the first frame of data.

4. The method of claim 2, further comprising:
   applying a second erasure window to the second data set; and
   nulling the data in the second erasure window.

5. The method of claim 1, further comprising:
   applying a second erasure window to the first data set; and
   nulling the data in the second erasure window.

6. The method of claim 1, comprising performing frame matching in conjunction with erasure windowing on the data to recover the first frame of data.

7. The method of claim 1, further comprising:
   decoding the first frame of data to produce a set of digital data; and
   outputting the set of digital data.

8. An apparatus comprising:
   a channel configured to receive data, the data including at least a first frame of data, a first sync mark indicating a relative position of the first frame of data, and a first preamble corresponding to the first frame of data;
   a decode circuit configured to attempt to determine the first frame of data at a first position based on the first sync mark; and
   a recovery element configured to, when the first frame of data is not determined, attempt to recover the first frame of data by performing frame matching at least at a second position different from the first position in conjunction with erasure windowing on the data.

9. The apparatus of claim 8, the recovery element configured to perform frame matching by:
   applying a first frame window at the second position different from the first position to the data to define a first data set of the data, a length of the first frame window corresponding to a length of the first frame of data; and
   providing the first data set to the decode circuit for attempted decoding of the first data set.

10. The apparatus of claim 9, the recovery element configured to perform erasure windowing by:
    applying a first erasure window to the first data set; and
    nulling the data in the first erasure window.

11. The apparatus of claim 9, the recovery element configured to perform frame matching by:
    applying a second frame window to the data to define a second data set of the data different from the first data set, a length of the second frame window corresponding to the length of the first frame of data; and
    providing the second data set to the decode circuit for attempted decoding of the second data set.

12. The apparatus of claim 11, the recovery element configured to perform erasure windowing by:
    applying a second erasure window to the second data set; and
    nulling the data in the second erasure window.

13. The apparatus of claim 10, the recovery element configured to perform erasure windowing by:
    applying a second erasure window different from the first erasure window to the first data set; and
    nulling the data in the second erasure window.

14. The apparatus of claim 8, the decode circuit configured to:
    decode the first frame of data to produce a set of digital data; and
    output the set of digital data.

15. The apparatus of claim 11, the recovery element configured to perform frame matching iteratively.

16. An apparatus comprising:
    a receiver device configured to:
    recover data corresponding to corrupted data by iteratively performing frame matching on the corrupted data in conjunction with applying an erasure window to the corrupted data, the corrupted data caused by defects in a corresponding preamble, and the data including at least a first frame of data and a first sync mark indicating a relative position of the first frame of data, the frame matching at least applying a first frame window at a second position different from the relative position of the first frame of data indicated by the first sync mark.

17. The apparatus of claim 16, the sync mark including corrupted synchronization data, and the first frame of data including corrupted data.

18. The apparatus of claim 16, the receiver device configured to iteratively apply frame windows to the data, one or more of the frame windows defining a different respective set of data.

19. The apparatus of claim 18, the receiver device configured to, for each frame window applied, also apply a respective erasure window.

20. The apparatus of claim 18, the receiver device configured to apply different erasure windows based on iteratively applying the frame windows.

* * * * *